(12) United States Patent
Sebastian et al.

(10) Patent No.: US 10,237,985 B2
(45) Date of Patent: Mar. 19, 2019

(54) METHOD OF PATTERNING A METAL ON A TRANSPARENT CONDUCTOR

(71) Applicant: 3M INNOVATIVE PROPERTIES COMPANY, St. Paul, MN (US)

(72) Inventors: Muthu Sebastian, Singapore (SG); Fong Liang Tan, Singapore (SG)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 137 days.

(21) Appl. No.: 15/318,689

(22) PCT Filed: Jun. 12, 2015

(86) PCT No.: PCT/US2015/035541
§ 371 (c)(1),
(2) Date: Dec. 14, 2016

(87) PCT Pub. No.: WO2015/200008
PCT Pub. Date: Dec. 30, 2015

(65) Prior Publication Data
US 2017/0135229 A1    May 11, 2017

Related U.S. Application Data

(60) Provisional application No. 62/015,591, filed on Jun. 23, 2014.

(51) Int. Cl.
*H05K 3/46* (2006.01)
*G06F 3/041* (2006.01)
(Continued)

(52) U.S. Cl.
CPC ............. *H05K 3/467* (2013.01); *C23C 14/00* (2013.01); *C23C 14/083* (2013.01); *C23C 14/14* (2013.01);
(Continued)

(58) Field of Classification Search
CPC ........ H05K 3/467; H05K 1/09; H05K 1/0274; H05K 3/067; H05K 3/16; H05K 3/388;
(Continued)

(56) References Cited

U.S. PATENT DOCUMENTS 4,336,100 A * 6/1982 Passlick ................ H05K 1/056
216/19
5,139,607 A * 8/1992 Ward ....................... C09D 9/00
216/83
(Continued)

FOREIGN PATENT DOCUMENTS

JP    2008-080743    4/2008
WO    WO 2012/153573    11/2012

OTHER PUBLICATIONS

PCT International Search Report from PCT/US2015/035541, dated Sep. 11, 2015, 3 pages.

*Primary Examiner* — Duy Vu N Deo
(74) *Attorney, Agent, or Firm* — Jonathan L. Tolstedt

(57) ABSTRACT

The present disclosure provides a method to provide a conductive bus bar on a patterned transparent conductor, such as ITO traces used for touch screen manufacturing. The method can be a cheaper and a more convenient technique to pattern a conductive metal or metal alloy, such as copper, silver, or a copper/silver/titanium alloy, on ITO electrodes in a roll-to-roll process.

20 Claims, 4 Drawing Sheets

(51) Int. Cl.
    H01L 31/18      (2006.01)
    C23C 14/00      (2006.01)
    H05K 3/16       (2006.01)
    H05K 3/38       (2006.01)
    G06F 3/044      (2006.01)
    C23C 14/08      (2006.01)
    C23C 14/14      (2006.01)
    C23C 14/34      (2006.01)
    C23C 18/16      (2006.01)
    C23C 18/38      (2006.01)
    C23C 18/42      (2006.01)
    C25D 3/38       (2006.01)
    C25D 3/46       (2006.01)
    C25D 5/48       (2006.01)
    C25D 5/54       (2006.01)
    G03F 7/20       (2006.01)
    G03F 7/40       (2006.01)
    H05K 1/02       (2006.01)
    H05K 1/09       (2006.01)
    H05K 3/06       (2006.01)
    C25D 7/00       (2006.01)

(52) U.S. Cl.
    CPC ............ *C23C 14/34* (2013.01); *C23C 18/165* (2013.01); *C23C 18/1689* (2013.01); *C23C 18/38* (2013.01); *C23C 18/42* (2013.01); *C25D 3/38* (2013.01); *C25D 3/46* (2013.01); *C25D 5/48* (2013.01); *C25D 5/54* (2013.01); *G03F 7/2002* (2013.01); *G03F 7/40* (2013.01); *G06F 3/041* (2013.01); *G06F 3/044* (2013.01); *H01L 31/1884* (2013.01); *H05K 1/0274* (2013.01); *H05K 1/09* (2013.01); *H05K 3/064* (2013.01); *H05K 3/067* (2013.01); *H05K 3/16* (2013.01); *H05K 3/388* (2013.01); *C25D 7/00* (2013.01); *G06F 2203/04103* (2013.01); *H05K 3/381* (2013.01); *H05K 2201/0108* (2013.01); *H05K 2201/0326* (2013.01); *H05K 2201/10128* (2013.01)

(58) Field of Classification Search
    CPC . H05K 2201/0326; H05K 2201/10128; H05K 2201/0108; C23C 14/34; C23C 18/165; C23C 18/1689; C23C 18/38; C25D 3/38; C25D 7/00; H01L 31/1884; G06F 3/041; G06F 2203/04103
    See application file for complete search history.

(56) References Cited

U.S. PATENT DOCUMENTS

| | | |
|---|---|---|
| 5,886,763 A | 3/1999 | Wolkowicz et al. |
| 2003/0170925 A1 | 9/2003 | Kim et al. |
| 2005/0118436 A1 | 6/2005 | Bhangale et al. |
| 2005/0252390 A1 | 11/2005 | Chen |
| 2006/0131616 A1* | 6/2006 | Devaney ............ A61B 5/14532 257/226 |
| 2008/0188020 A1 | 8/2008 | Wei-Min et al. |
| 2012/0038564 A1* | 2/2012 | Kim .................... G06F 3/041 345/173 |
| 2012/0073866 A1* | 3/2012 | Hirai ................... G06F 3/044 174/257 |
| 2014/0124477 A1* | 5/2014 | Sebastian ............ C09K 13/04 216/41 |

* cited by examiner

METHOD OF PATTERNING A METAL ON A TRANSPARENT CONDUCTOR

BACKGROUND

Touch screens are prevalent today, and generally include a transparent base substrate such as glass or polyethylene terephthalate (PET), and a transparent conductor pattern such as Indium Tin Oxide (ITO) on the base substrate. A conductive metal pattern such as copper and silver can be formed on the edges of the ITO pattern to provide a more conductive bus bar to reduce the resistivity in the touch screen.

Conductive metal patterns are typically provided with a conductive adhesive used to adhere the conductive metal pattern to the ITO pattern. In this case, resistivity can increase over time, and the conductive adhesive may fail at high temperature and humidity. Other conventional methods such as applying a silver frit are costly and may require a costly indium-based solder to be used for the attachment of wires. Electro-deposition of conductive metals generally is not possible because of the poor current carrying capacity of ITO. Similarly, electroless deposition of metals can be challenging, as the chemicals in a plating bath can undergo undesirable side reactions with the ITO, often resulting in etching of the ITO while plating. Silver ink printing on the ITO has also been used to provide the bus bar, but can be very expensive and not suitable for a fine pitch patterning.

SUMMARY

The present disclosure provides a method to provide a conductive bus bar on a patterned transparent conductor, such as ITO traces used for touch screen manufacturing. The method can be a cheaper and a more convenient technique to pattern a conductive metal or metal alloy, such as copper, silver, or a copper/silver/titanium alloy, on ITO electrodes in a roll-to-roll process. In one aspect, the present disclosure provides a method of patterning a conductive laminate that includes coating a transparent conducting oxide layer on a substrate; sputtering a tie layer on the transparent conducting oxide layer; sputtering a first metallic layer on the tie layer; plating a second metallic layer on the first metallic layer to form a conductive laminate on the substrate; and selectively removing the conductive laminate to form a conductive pattern on the substrate.

In another aspect, the step of selectively removing the conductive laminate further includes applying a photoresist layer to the second metallic layer; patterning the photoresist layer to selectively expose the second metallic layer; removing the exposed second metallic layer and the adjacent first metallic layer beneath, thereby selectively exposing the tie layer; removing the selectively exposed tie layer, thereby selectively exposing the adjacent transparent conducting oxide layer beneath; removing the exposed transparent conducting oxide layer; and removing any remaining photoresist to form a patterned conductive laminate.

In yet another aspect, the method of patterning a conductive laminate further includes applying a second photoresist layer to the patterned conductive laminate; patterning the photoresist layer to selectively expose the second metallic layer of the patterned conductive laminate; removing the exposed second metallic layer and the adjacent first metallic layer beneath, thereby exposing the tie layer of the patterned conductive laminate; removing the exposed tie layer, thereby exposing the adjacent transparent conducting oxide layer of the patterned conductive laminate; and removing any remaining photoresist to form a patterned transparent conducting oxide layer in electrical contact with the conductive laminate.

In yet another aspect, the present disclosure provides a method of patterning a conductive laminate that includes providing an indium tin oxide coated substrate; sputtering a chrome oxide layer on the indium tin oxide; sputtering a first copper layer on the chrome oxide layer; plating a second copper layer on the first copper layer to form a conductive laminate on the substrate; applying a photoresist layer to the second copper layer; and patterning the photoresist layer to selectively expose the second copper layer. The method further includes removing the exposed second copper layer and the adjacent first copper layer beneath, thereby selectively exposing the chrome oxide layer; removing the selectively exposed chrome oxide layer, thereby selectively exposing the indium tin oxide; removing the indium tin oxide; and removing any remaining photoresist to form a patterned conductive laminate.

In yet another aspect, the method of patterning a conductive laminate further includes applying a second photoresist layer to the patterned conductive laminate; patterning the photoresist layer to selectively expose the second copper layer of the patterned conductive laminate; removing the exposed second copper layer and the adjacent first copper layer beneath, thereby exposing the chrome oxide layer of the patterned conductive laminate; removing the exposed chrome oxide layer, thereby exposing the adjacent indium tin oxide layer of the patterned conductive laminate; and removing any remaining photoresist to form a patterned indium tin oxide layer in electrical contact with the conductive laminate.

The above summary is not intended to describe each disclosed embodiment or every implementation of the present disclosure. The figures and the detailed description below more particularly exemplify illustrative embodiments.

BRIEF DESCRIPTION OF THE DRAWINGS

Throughout the specification reference is made to the appended drawings, where like reference numerals designate like elements, and wherein.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
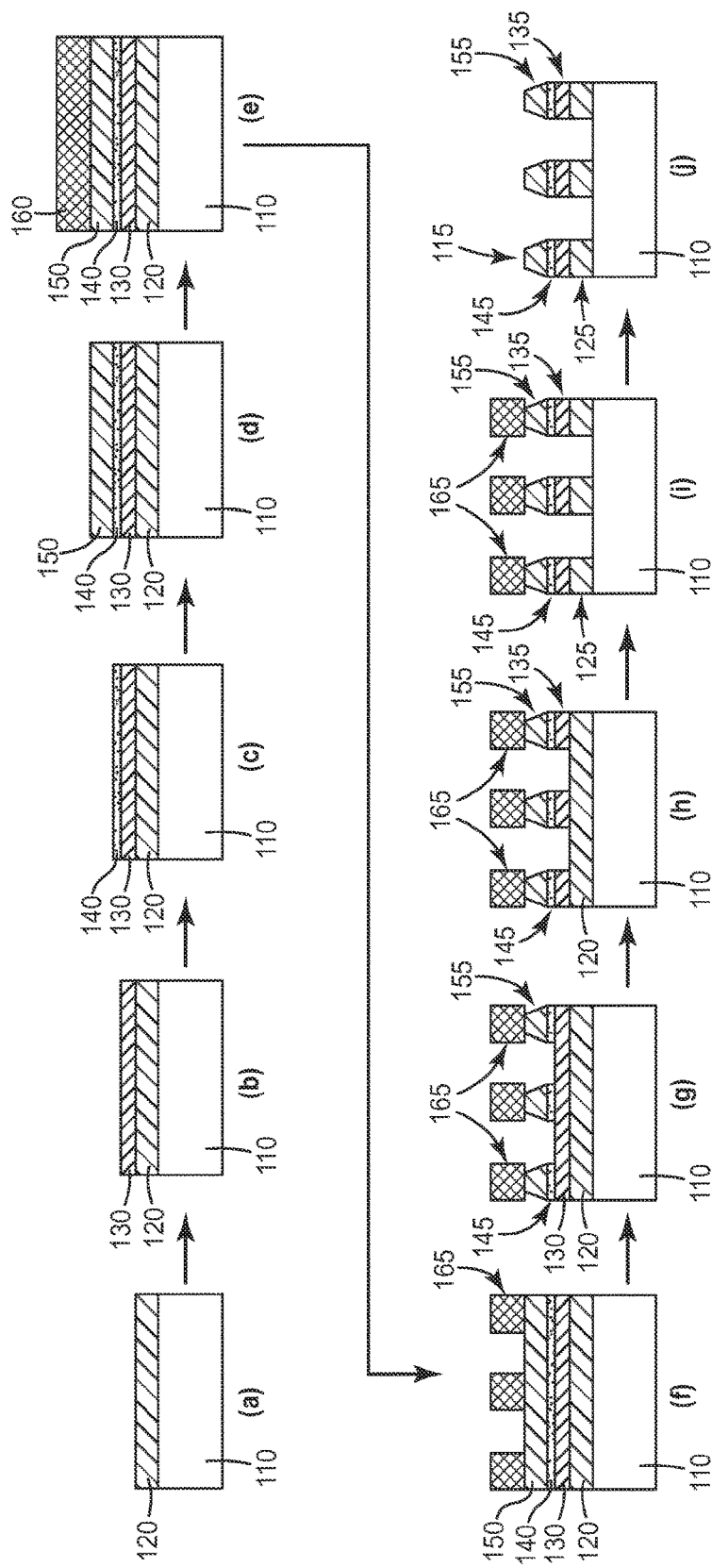
FIG. 1 shows a schematic cross-sectional view of a method of patterning a metallic conductor on a transparent conductor.

The present disclosure provides a method to provide a conductive bus bar on a patterned transparent conductor, such as ITO traces used for touch screen manufacturing. The method can be a cheaper and a more convenient technique to pattern a conductive metal or metal alloy, such as copper, silver, or a copper/silver/titanium alloy, on ITO electrodes in a roll-to-roll process. In one particular embodiment, chrome oxide and copper are sequentially deposited on an ITO substrate. The copper conductive bus-bar pattern results from using the chrome oxide as a protective mask for the underlying ITO, while etching the copper selectively from ITO, and finally the ITO can be patterned by a conventional etching process.

In the following description, reference is made to the accompanying drawings that forms a part hereof and in which are shown by way of illustration. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

As used herein, "have", "having", "include", "including", "comprise", "comprising" or the like are used in their open ended sense, and generally mean "including, but not limited to." It will be understood that the terms "consisting of" and "consisting essentially of" are subsumed in the term "comprising," and the like.

FIG. 1 shows a schematic cross-sectional view of a method of patterning a metallic conductor on a transparent conductor, according to one aspect of the disclosure. In one particular embodiment, the method provides a conductive metal (e.g. copper) on ITO electrodes as a bus bar to improve the conductance. In step (a), a transparent conductor 120 is deposited on a substrate 110. Transparent conductor 120 can be any transparent conductor suitable for use in touch-screen applications including, for example, indium tin oxide (ITO), zinc oxide (ZO), indium zinc oxide (IZO), and the like, or combinations thereof. Although for brevity, throughout the following discussion ITO is referred to as the transparent conductor, it is to be understood that any suitable transparent conductor can be substituted for ITO. In some cases, ITO can be deposited to a thickness of from about 20 nm to about 80 nm thick. In one particular embodiment, ITO can be deposited to a thickness of 30 nm.

Substrate 110 can be any suitable substrate that is preferably transparent to visible light and onto which ITO can be deposited and adhered, including, for example, glass such as float glass or flexible glass, and polymers such as polyethylene terephthalate (PET), polyethylene naphthalate (PEN), or the like, or copolymers thereof. In one particular embodiment, an ITO layer is sputtered on a glossy transparent substrate such as PET.

In step (b), a tie layer 130 is deposited on the transparent conductor 120, preferably by sputtering. In one particular embodiment, the tie layer 130 serves both to protect the underlying transparent conductor 120 from adjacent patterning processes, and to improve adhesion between the transparent conductor 120 and subsequent layers. In one particular embodiment, the tie layer 130 is a sputtered chrome oxide layer. In some cases, the chrome oxide can be sputtered to a thickness of from about 10 nm to about 100 nm. In one particular embodiment, the chrome oxide can be sputtered to a thickness of about 20 nm.

In step (c), a first metallic layer 140 is deposited on the tie layer 130, preferably by sputtering immediately after the tie layer 130. The first metallic layer 140 can be used to provide a "seed" layer that can both adhere well to the underlying tie layer 130, and also has a higher conductivity for subsequent plating operations used to deposit the metallic conductor. In one particular embodiment, the first metallic layer 140 is a sputtered copper layer. In some cases, the copper can be sputtered to a thickness of from about 300 to about 1000 nm. In one particular embodiment, the copper can be sputtered to a thickness of about 300 nm.

In step (d), a second metallic layer 150 is deposited on the first metallic layer 140, preferably by either conventional plating operations or by electroless plating. In one particular embodiment, the second metallic layer 150 is a copper layer. By electroplating the copper layer on the sputtered copper layer, the bus lines can be deposited to any desired thickness. Chrome oxide lies between the ITO and copper layer, and thus acts as protective mask while pattering the copper. In some cases, the copper can be electroplated to a thickness of from about 3 microns to about 12 microns thick. In one particular embodiment, the copper can be plated to a thickness of about 5 microns.

In step (e), a photoresist layer 160 is deposited on the second metallic layer 150. In one particular embodiment, the photoresist layer 160 is a dry photoresist layer that can be laminated to the second metallic layer 150 in roll-to-roll process. Any conventional photoresist material can be used for the photoresist layer 160.

In step (f), a conventional photo tool (not shown) of the desired pattern is used to selectively expose the photoresist layer 160 using UV light (e.g., at an intensity of 50-120 mJ/cm2). The light-exposed areas are polymerized, whereas the light-masked areas are protected from polymerization.

The UV-light exposed photoresist layer 160 can be developed using, for example, a dilute sodium bicarbonate solution, as known to one of skill in the art. During the development process the polymerized photoresist layer 160 remains intact whereas the non-polymerized photoresist removed from the substrate, resulting in a desired photoresist pattern 165 on the second metal layer 150.

In step (g), the first metallic layer 140 and the second metallic layer 150 are patterned by etching, to form patterned first and second metallic layers 145, 155. In one particular embodiment, a cupric chloride solution can be used to etch the copper in first and second metallic layers 140, 150, to form the copper pattern. Cupric chloride selectively etches the copper without affecting chrome oxide middle layer and the ITO bottom layer, and it is to be understood that any copper not protected by the photoresist pattern 165 can be etched away. The etching time can vary depending on the thickness of the copper plated on the ITO. Generally, cupric chloride at a concentration of between about 120 g/l to 180 g/l used at a temperature of between 50 C and 80 C provides better etching with excellent etching profile.

In step (h), the tie layer 130 is selectively removed by etching, to form a patterned tie layer 135 on the unpatterned transparent conductor layer 120. In one particular embodiment, the chrome oxide tie layer can be removed by using a dilute potassium permanganate ($KMnO_4$) solution at a temperature from about 35 C to about 50 C for about 30 seconds. It is to be noted that in some cases, a longer dipping time (more than 30 seconds) may lead to stripping of the underlying ITO layer, and is to be avoided.

In step (i) the transparent conductor layer 120 can be patterned using a mineral acid, such as hydrochloric acid or Aqua Regia, to result in the desired patterned transparent conductor layer 125.

In step (j), after the completion of ITO and copper patterning by the previous wet chemical etching method, the remaining patterned photoresist layer 165 can be stripped using, for example, an alkali stripping solution, resulting in patterned bus-bars 115 disposed on substrate 110.

In one particular embodiment, the present disclosure relates to patterning of a transparent ITO circuit pattern and providing a conductive bus bar on the ITO circuit for making touch screen panels. Copper and chrome oxide are sputtered on the transparent ITO layer and then all of the layers are patterned by a selective etching method. A cupric chloride etchant was used to etch the copper selectively without affecting the ITO layer, and a chrome oxide layer acts as mask while etching copper from the ITO. After etching the copper, the chrome oxide was etched using $KMnO_4$ without affecting the ITO beneath, and finally the ITO was patterned using aqueous mineral acid in a conventional technique.

The following examples and process methods are given as illustrative only, and are not intended to limit the scope of invention.

EXAMPLES

Etching chemistry for Selective Etching of Copper, Chrome Oxide and ITO

A formulation including $CuCl_2 \cdot 5H_2O$ at a concentration of between 120 and 180 g/l, HCl at a concentration of between 0.1 and 1.0 N, and at a temperature of between 45 C and 75 C, was used to etch copper selectively without affecting the chrome oxide tie layer and the ITO layer beneath. The etching time varied, depending on the copper thickness, and oxidizing agents such as hydrogen peroxide and sodium chlorate can be used as replenishing agents.

The chrome oxide tie layer was etched using a formulation including $KMnO_4$ at a concentration of about 25 g/l (from about 5-25 g/l can be acceptable), KOH at a concentration of about 32 g/l (from about 0 to 32 g/l can be acceptable), and at a temperature between about 25 C and 28 C for about 30 seconds; however, temperatures between about 35 and 50 C can be acceptable. Selective etching of chrome oxide from ITO required monitoring the etching time closely, as etching time exceeding 30 may lead to ITO stripping from the PET substrate. ITO was etched using HCl at a concentration of 2N at a temperature of 35 C; however, from about 35 to about 60 C can be acceptable. In some cases, the chrome oxide layer can instead be etched by using a 5% $KMnO_4$ solution at about 50 C, without the presence of KOH.

The etched surfaces were analyzed using transmittance and Energy Dispersive X-ray (EDX) spectrographic analysis to determine trace elements. The ITO sample showed a transmittance of 65.71% at 500 nm (ITO control). After sputtering chrome oxide, the transmittance dropped to 50% (ITO+CrOX). After etching chrome oxide selectively from the ITO surface, the transmittance increased to 62.47%, which is very close to the ITO control sample. After etching the ITO from the PET substrate, the transmittance increased to 86.85%, which is close to transmittance of raw PET. Transmittance value of PET and ITO can vary from 60-95% depending on the base PET substrate and ITO thickness.

Etching was further confirmed by SEM-EDX analysis, which showed the presence of In, Sn and Cr after selectively etching copper from ITO. This result confirmed that chrome oxide acts as etching mask and protects the ITO while copper was etched by the cupric chloride solution.

Example 1

Patterning Method I

Figure 2A:
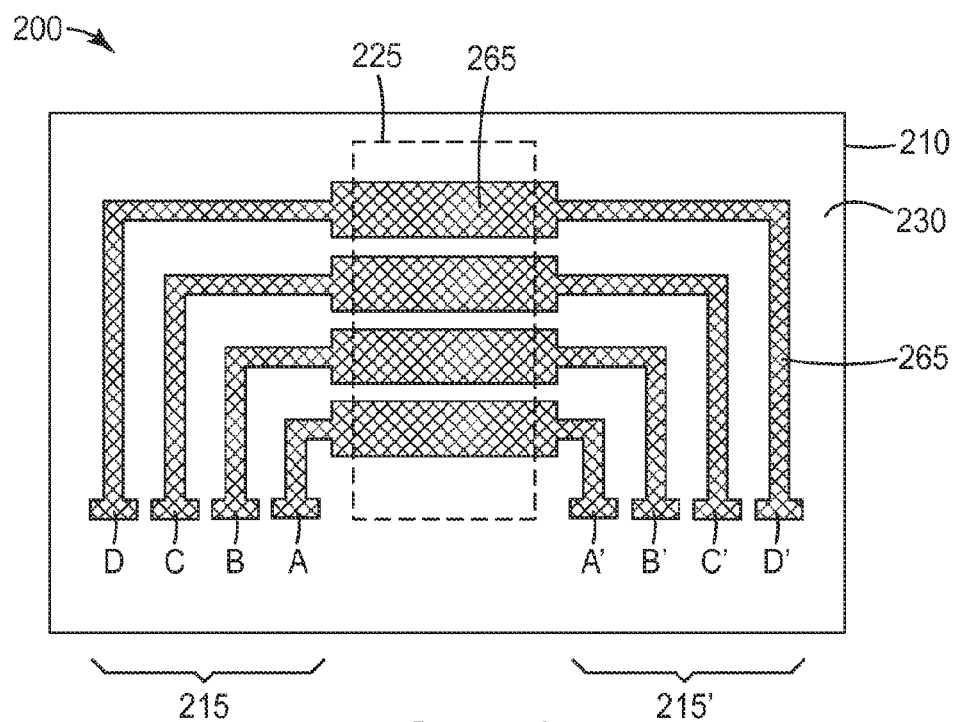
FIGS. 2A-2C show schematic overhead views of intermediate steps for a patterned metallic conductor on a transparent conductor.
Figure 2B:
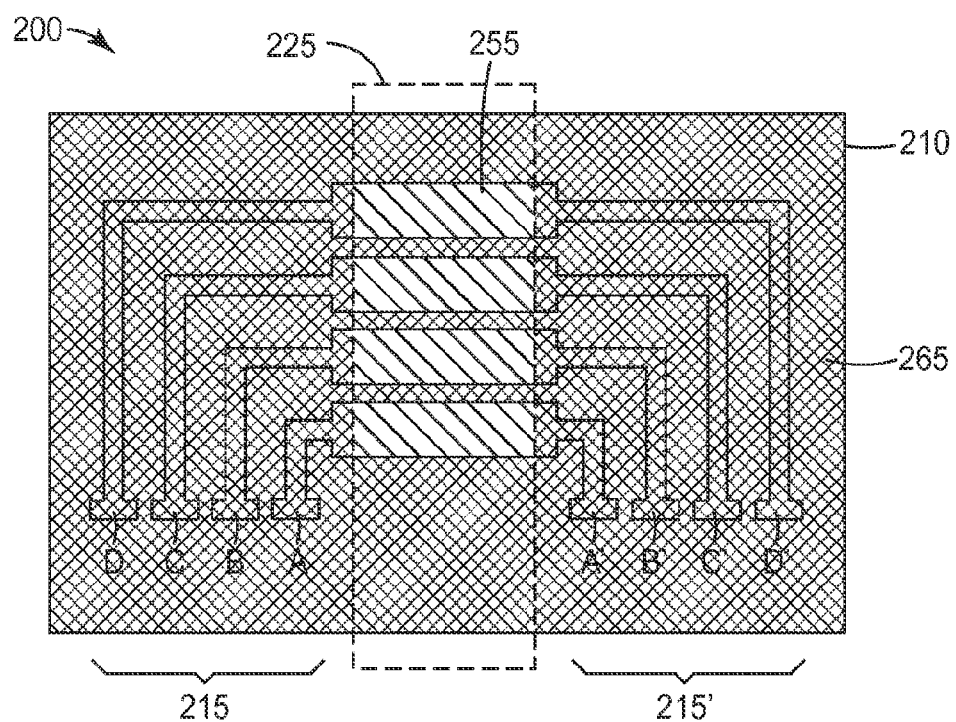
Figure 2C:
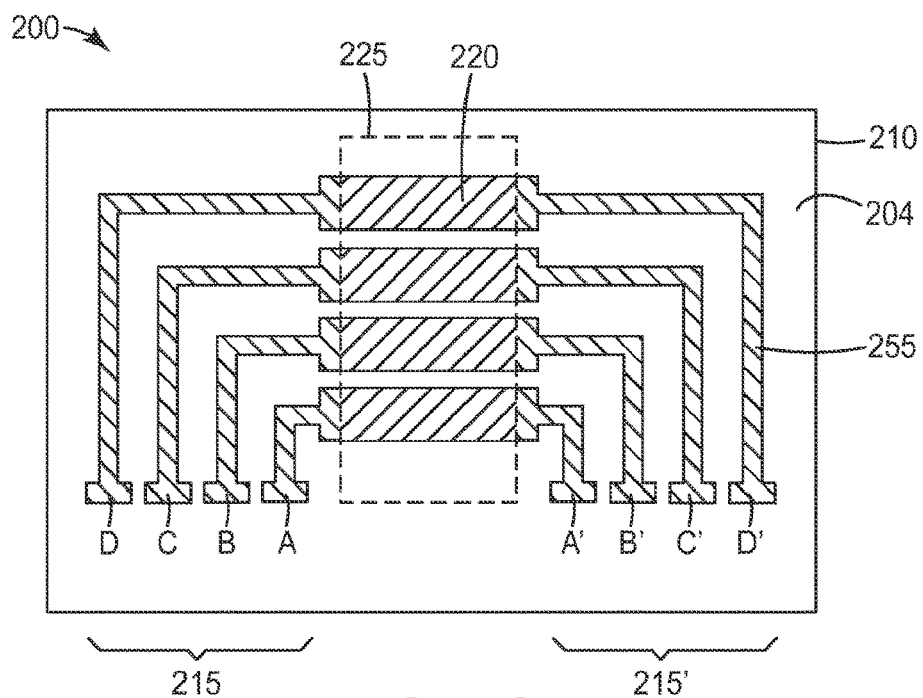

FIGS. 2A-2C show schematic overhead views of intermediate steps for a patterned metallic conductor on a transparent conductor used as a testing coupon, according to one aspect of the disclosure. The general process steps for producing the patterned metallic conductor on a transparent conductor in method I include, in order and as described elsewhere: ITO sputtering on PET; chrome oxide sputtering on ITO; copper sputtering on the chrome oxide; copper plating on the sputtered copper; lamination of photoresist on copper; UV-light expose to get the photoresist pattern; develop the photoresist pattern; etch the copper; strip the photoresist; etch the chrome oxide using $KMnO_4$; etch the ITO by HCl; second lamination of photoresist; UV-light flood expose (bus bar masked); develop photoresist; selectively etch copper from the ITO; strip remaining photoresist; and selectively etch the chrome oxide.

In FIG. 2A, after sputtering about 20 nm chrome oxide and 300 nm copper on the 30 nm ITO coated substrate, copper was electroplated to a thickness of 5 microns, and the copper side was laminated to a KM1150 dry photoresist (available from Hitachi Chemical Co., Ltd). The ITO and copper pattern were exposed to 100 mJ UV light, and the unexposed regions were washed away in an 8% sodium bicarbonate solution at room temperature, resulting in an intermediate patterned substrate 200 including a substrate 210 having an exposed chrome oxide layer 230, and a patterned photoresist 265. The patterned photoresist 265 is disposed in a first conductive bus-bar region 215, a touchscreen region 225, and a second conductive bus-bar region 215'. The schematic overhead view shown in FIG. 2A generally corresponds to process step (g) shown in FIG. 1.

The exposed chrome oxide layer 230 and the underlying ITO layer of FIG. 2A outside of the patterned photoresist 265 was removed by etching with $KMnO_4$ and HCl, respectively, as described elsewhere, and the photoresist was stripped using a dilute alkaline solution of about 4-5% NaOH (KOH would also be acceptable). A second lamination and patterning of the photoresist resulted in the intermediate patterned substrate 200 of FIG. 2B, having patterned photoresist 265, and patterned copper layer 255 above chrome oxide 230' (not shown) over patterned ITO layer (not shown) in the touchscreen region 225. The patterned copper was etched by cupric chloride etchant and the patterned photoresist 265 stripped. Chrome oxide 230' was again etched using $KMnO_4$, to result in patterned ITO 220 in touchscreen region 225 in electrical contact with patterned copper 255 in the first and second conductive bus-bar regions 215, 215', as shown in FIG. 2C.

Resistance Measurement:

After patterning, the ITO and copper bus bar resistance was measured using a Fluke two point resistive meter. The resistance, in ohms, was measured between contact pads as shown in Table 1. After patterning ITO and copper, the resistance increased based on the distance between the two measurement locations, and there is no conductance between the adjacent traces. This confirms the clean etching of ITO between the adjacent traces which otherwise will result in short circuit.

TABLE 1

| Measurement Location | Resistance (ohms) |
|---|---|
| A-A' | 10.8 |
| B-B' | 13.6 |
| C-C' | 14.5 |
| D-D' | 32.7 |
| A-B | ∞ |
| A-C | ∞ |
| A-D | ∞ |

Example 2

Patterning Method II

Figure 3A:
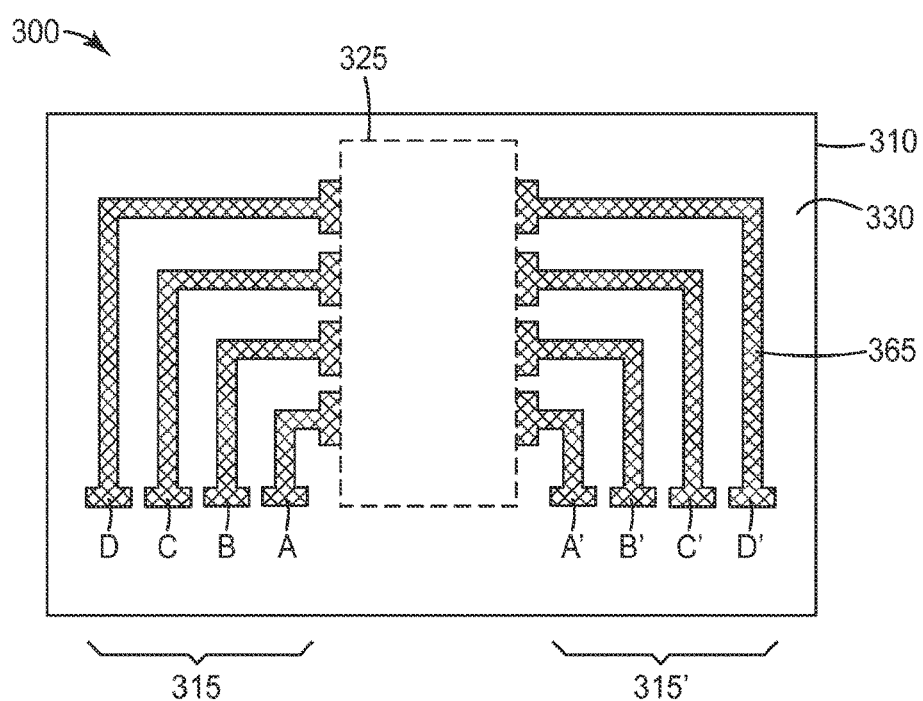
FIGS. 3A-3C show schematic overhead views of intermediate steps for a patterned metallic conductor on a transparent conductor.
Figure 3B:
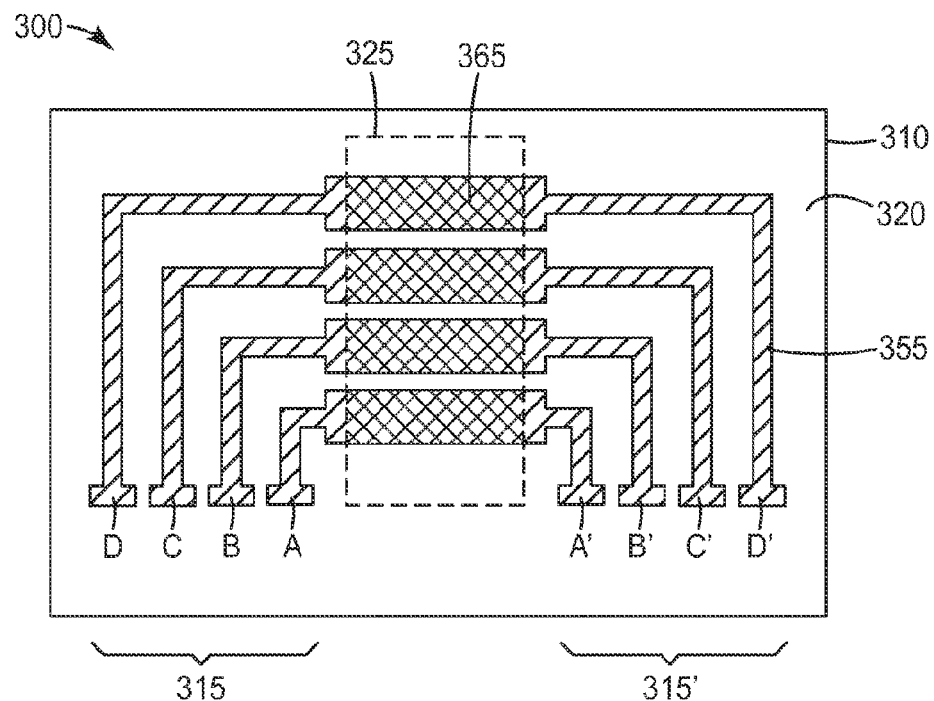
Figure 3C:
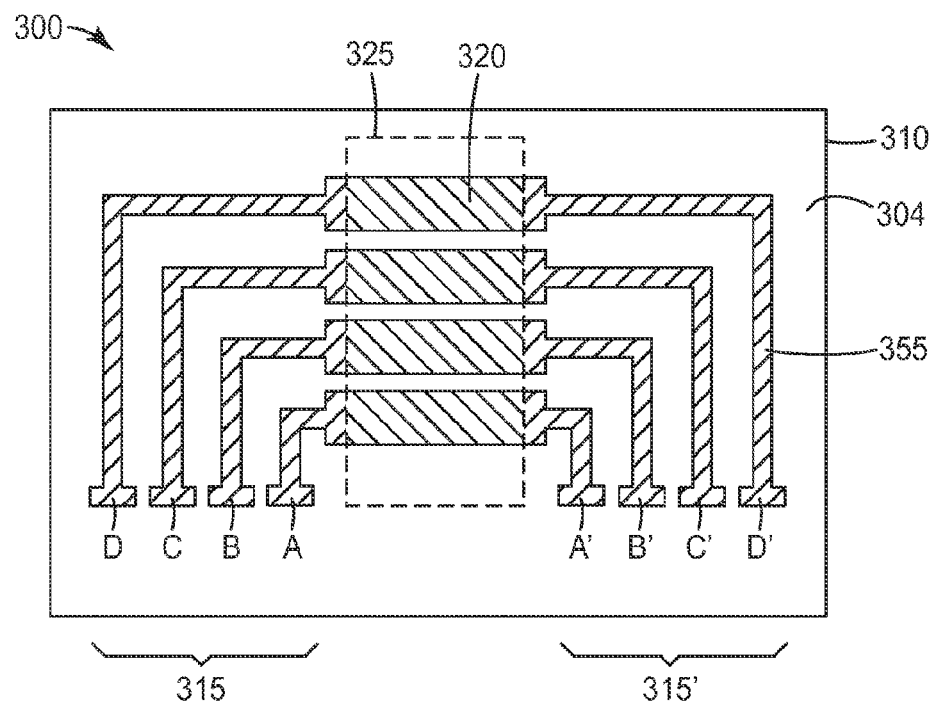

FIGS. 3A-3C show intermediate steps for a patterned metallic conductor on a transparent conductor used as a testing coupon, according to one aspect of the disclosure. The same experimental method was used as given in Example 1, except changing the order of process steps. The general process steps for producing the patterned metallic conductor on a transparent conductor in method II include, in order and as described elsewhere: ITO sputtering on PET; chrome oxide sputtered on ITO; copper sputtering on chrome oxide; copper plating on sputtered copper; lamination of photoresist on copper; UV-light expose to get copper bus bar pattern (bus bar masked); develop the photoresist pattern; etch the copper except bus bar; strip the photoresist; etch the chrome oxide using $KMnO_4$; second photoresist lamination; UV-light expose (ITO masked); develop photoresist; etch the ITO using HCl; and strip the remaining photoresist.

In FIG. 3A, after sputtering about 20 nm of chrome oxide and 300 nm copper on the 30 nm thick ITO coated substrate, copper was electroplated to a thickness of 12 microns, and the copper side was laminated to a KM1150 dry photoresist (available from Hitachi Chemical Co., Ltd). The ITO and copper pattern were exposed to 100 mJ UV light, and the unexposed regions were washed away in an 8% sodium bicarbonate solution at room temperature, resulting in an intermediate patterned substrate 300 including a substrate 310 having an exposed chrome oxide layer 330, and a patterned photoresist 365. The patterned photoresist 365 is disposed in a first conductive bus-bar region 315, and a second conductive bus-bar region 315'. The patterned photoresist was removed from other regions including touchscreen region 325.

First copper exposed layer 355 was etched using cupric chloride etchant. Photoresist 365 stripped using dilute alkaline hydroxide solution (4-5% NaOH or KOH) as described elsewhere. The exposed chrome oxide layer 330 was removed by etching with $KMnO_4$, as described elsewhere. A second lamination and patterning of the photoresist resulted in the intermediate patterned substrate 300 of FIG. 3B, having ITO surface 320, patterned photoresist 365 within touchscreen region 325, and patterned copper bus-bars 355 in first and second conductive bus-bar regions 315, 315'. The ITO surface 320 was then etched using HCl, and the patterned photoresist 365 stripped to result in patterned ITO 320 in touchscreen region 325 in electrical contact with patterned copper 355 in the first and second conductive bus-bar regions 315, 315' as shown in FIG. 3C. As HCl can etch both copper and ITO, copper thickness was kept thicker (13 um) and ITO was kept thinner (20 nm) so that ITO etched faster than Copper without affecting copper features.

Resistance Measurement:

After patterning, the ITO and copper bus bar resistance was measured using a Fluke two point resistive meter. The resistance, in ohms, was measured between contact pads as shown in Table 2. After patterning ITO and copper, the resistance increased based on the distance between the two measurement locations, and there is no conductance between the adjacent traces. This confirms the clean etching of ITO between the adjacent traces which otherwise will result in short circuit.

TABLE 2

| Measurement Location | Resistance (ohms) |
|---|---|
| A-A' | 0.024 |
| B-B' | 0.031 |
| C-C' | 0.035 |
| D-D' | 0.041 |
| A-B | ∞ |
| A-C | ∞ |
| A-D | ∞ |

Following are a list of embodiments of the present disclosure.

Item 1 is a method of patterning a conductive laminate, comprising: coating a transparent conducting oxide layer on a substrate; sputtering a tie layer on the transparent conducting oxide layer; sputtering a first metallic layer on the tie layer; plating a second metallic layer on the first metallic layer to form a conductive laminate on the substrate; and selectively removing the conductive laminate to form a conductive pattern on the substrate.

Item 2 is the method of item 1, wherein the conductive pattern comprises a first portion comprising the conductive laminate in electrical contact with a second portion comprising the transparent conducting oxide.

Item 3 is the method of item 2, wherein each of the first metallic layer and the second metallic layer comprise a conductive metal, a conductive metal alloy, or a combination thereof.

Item 4 is the method of item 3, wherein the conductive metal comprises copper or silver, and the conductive metal alloy comprises a copper/silver/titanium alloy.

Item 5 is the method of item 1 to item 4, wherein the transparent conducting oxide layer comprises indium tin oxide, zinc oxide, indium zinc oxide, or a combination thereof.

Item 6 is the method of item 1 to item 5, wherein the tie layer comprises chrome oxide, nickel chrome oxide, or a combination thereof.

Item 7 is the method of item 1 to item 6, wherein selectively removing the conductive laminate comprises: applying a photoresist layer to the second metallic layer; patterning the photoresist layer to selectively expose the second metallic layer; removing the exposed second metallic layer and the adjacent first metallic layer beneath, thereby selectively exposing the tie layer; removing the selectively exposed tie layer, thereby selectively exposing the adjacent transparent conducting oxide layer beneath; removing the exposed transparent conducting oxide layer; and removing any remaining photoresist to form a patterned conductive laminate.

Item 8 is the method of item 7, wherein applying the photoresist layer comprises laminating a dry photoresist to the conductive laminate.

Item 9 is the method of item 7 or item 8, wherein patterning the photoresist layer comprises patternwise exposure by ultraviolet light to polymerize the photoresist, and removing unpolymerized photoresist.

Item 10 is the method of item 9, wherein removing unpolymerized photoresist comprises contacting with a dilute sodium bicarbonate solution.

Item 11 is the method of item 7 to item 10, wherein removing the exposed second metallic layer and the adjacent first metallic layer beneath comprises etching.

Item 12 is the method of item 11, wherein for a copper first and second metallic layers, etching comprises contacting with a cupric chloride solution.

Item 13 is the method of item 7 to item 12, wherein removing the selectively exposed tie layer comprises etching with a dilute potassium permanganate solution.

Item 14 is the method of item 7 to item 13, wherein selectively removing the exposed transparent conducting oxide layer comprises etching using an acid.

Item 15 is the method of item 14, wherein the acid comprises hydrochloric acid or aqua regia.

Item 16 is the method of item 7 to item 15, wherein removing any remaining photoresist comprises washing with an alkalai solution.

Item 17 is the method of item 7 to item 16, further comprising: applying a second photoresist layer to the patterned conductive laminate; patterning the photoresist layer to selectively expose the second metallic layer of the patterned conductive laminate; removing the exposed second metallic layer and the adjacent first metallic layer beneath, thereby exposing the tie layer of the patterned conductive laminate; removing the exposed tie layer, thereby exposing the adjacent transparent conducting oxide layer of the patterned conductive laminate; and removing any remaining photoresist to form a patterned transparent conducting oxide layer in electrical contact with the conductive laminate.

Item 18 is a method of patterning a conductive laminate, comprising: providing an indium tin oxide coated substrate; sputtering a chrome oxide layer on the indium tin oxide; sputtering a first copper layer on the chrome oxide layer; plating a second copper layer on the first copper layer to form a conductive laminate on the substrate; applying a photoresist layer to the second copper layer; patterning the photoresist layer to selectively expose the second copper layer; removing the exposed second copper layer and the adjacent first copper layer beneath, thereby selectively exposing the chrome oxide layer; removing the selectively exposed chrome oxide layer, thereby selectively exposing the indium tin oxide; removing the indium tin oxide; and removing any remaining photoresist to form a patterned conductive laminate.

Item 19 is the method of item 18, further comprising: applying a second photoresist layer to the patterned conductive laminate; patterning the photoresist layer to selectively expose the second copper layer of the patterned conductive laminate; removing the exposed second copper layer and the adjacent first copper layer beneath, thereby exposing the chrome oxide layer of the patterned conductive laminate; removing the exposed chrome oxide layer, thereby exposing the adjacent indium tin oxide layer of the patterned conductive laminate; and removing any remaining photoresist to form a patterned indium tin oxide layer in electrical contact with the conductive laminate.

Item 20 is the method of item 19, wherein removing the exposed second copper layer and the adjacent first copper layer beneath comprises contacting with a cupric chloride solution.

Item 21 is the method of item 19 or item 20, wherein removing the selectively exposed chrome oxide layer comprises etching with a dilute potassium permanganate solution.

Unless otherwise indicated, all numbers expressing feature sizes, amounts, and physical properties used in the specification and claims are to be understood as being modified by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method of patterning a conductive laminate, comprising:
    coating a transparent conducting oxide layer on a substrate;
    sputtering a tie layer on the transparent conducting oxide layer;
    sputtering a first metallic layer on the tie layer;
    plating a second metallic layer on the first metallic layer to form a conductive laminate on the substrate;

selectively removing the conductive laminate using a first photoresist layer applied to the second metallic layer to form a conductive pattern on the substrate; and selectively removing at least a portion of the conductive pattern using a second photoresist layer applied to the conductive pattern to form a patterned transparent conducting oxide layer in electrical contact with the conductive laminate.

2. The method of claim 1, wherein the conductive pattern comprises a first portion comprising the conductive laminate in electrical contact with a second portion comprising the transparent conducting oxide.

3. The method of claim 2, wherein each of the first metallic layer and the second metallic layer comprise a conductive metal, a conductive metal alloy, or a combination thereof.

4. The method of claim 3, wherein the conductive metal comprises copper or silver, and the conductive metal alloy comprises a copper/silver/titanium alloy.

5. The method of claim 1, wherein the transparent conducting oxide layer comprises indium tin oxide, zinc oxide, indium zinc oxide, or a combination thereof.

6. The method of claim 1, wherein the tie layer comprises chrome oxide, nickel chrome oxide, or a combination thereof.

7. The method of claim 1, wherein selectively removing the conductive laminate further comprises:
   applying the photoresist layer to the second metallic layer;
   patterning the photoresist layer to selectively expose the second metallic layer;
   removing the exposed second metallic layer and the adjacent first metallic layer beneath, thereby selectively exposing the tie layer;
   removing the selectively exposed tie layer, thereby selectively exposing the adjacent transparent conducting oxide layer beneath;
   removing the exposed transparent conducting oxide layer; and
   removing any remaining photoresist to form a patterned conductive laminate.

8. The method of claim 7, wherein applying the photoresist layer comprises laminating a dry photoresist to the conductive laminate.

9. The method of claim 7, wherein patterning the photoresist layer comprises patternwise exposure by ultraviolet light to polymerize the photoresist, and removing unpolymerized photoresist.

10. The method of claim 9, wherein removing unpolymerized photoresist comprises contacting with a dilute sodium bicarbonate solution.

11. The method of claim 7, wherein removing the exposed second metallic layer and the adjacent first metallic layer beneath comprises etching.

12. The method of claim 11, wherein for a copper first and second metallic layers, etching comprises contacting with a cupric chloride solution.

13. The method of claim 7, wherein removing the selectively exposed tie layer comprises etching with a dilute potassium permanganate solution.

14. The method of claim 7, wherein selectively removing the exposed transparent conducting oxide layer comprises etching using an acid.

15. The method of claim 14, wherein the acid comprises hydrochloric acid or aqua regia.

16. The method of claim 7, wherein removing any remaining photoresist comprises washing with an alkalai solution.

17. The method of claim 7, wherein selectively removing the conductive pattern further comprises:
   applying the second photoresist layer to the patterned conductive laminate;
   patterning the photoresist layer to selectively expose the second metallic layer of the patterned conductive laminate;
   removing the exposed second metallic layer and the adjacent first metallic layer beneath, thereby exposing the tie layer of the patterned conductive laminate;
   removing the exposed tie layer, thereby exposing the adjacent transparent conducting oxide layer of the patterned conductive laminate; and
   removing any remaining photoresist to form a patterned transparent conducting oxide layer in electrical contact with the conductive laminate.

18. A method of patterning a conductive laminate, comprising:
   providing an indium tin oxide coated substrate;
   sputtering a chrome oxide layer on the indium tin oxide;
   sputtering a first copper layer on the chrome oxide layer;
   plating a second copper layer on the first copper layer to form a conductive laminate on the substrate;
   applying a first photoresist layer to the second copper layer;
   patterning the first photoresist layer to selectively expose the second copper layer;
   removing the exposed second copper layer and the adjacent first copper layer beneath, thereby selectively exposing the chrome oxide layer;
   removing the selectively exposed chrome oxide layer, thereby selectively exposing the indium tin oxide;
   removing the indium tin oxide;
   removing any remaining photoresist to form a patterned conductive laminate;
   applying a second photoresist layer to the patterned conductive laminate;
   patterning the second photoresist layer to selectively expose the second copper layer of the patterned conductive laminate;
   removing the exposed second copper layer and the adjacent first copper layer beneath, thereby exposing the chrome oxide layer of the patterned conductive laminate;
   removing the exposed chrome oxide layer, thereby exposing the adjacent indium tin oxide layer of the patterned conductive laminate; and
   removing any remaining photoresist to form a patterned indium tin oxide layer in electrical contact with the conductive laminate.

19. The method of claim 18, wherein removing the exposed second copper layer and the adjacent first copper layer beneath comprises contacting with a cupric chloride solution.

20. The method of claim 18, wherein removing the selectively exposed chrome oxide layer comprises etching with a dilute potassium permanganate solution.

* * * * *